United States Patent [19]

Danish

[11] Patent Number: 4,532,497
[45] Date of Patent: Jul. 30, 1985

[54] MATRIX KEYBOARD WITH PLURALITY OF SEQUENCES OF CASCADED ELECTRICAL ELEMENTS

[75] Inventor: Sherif Danish, Tulsa, Okla.

[73] Assignee: Polytel Corp., Sunnyvale, Calif.

[21] Appl. No.: 458,018

[22] Filed: Jan. 14, 1983

[51] Int. Cl.³ .............................................. G06F 3/02
[52] U.S. Cl. ............................. 340/365 S; 340/365 R; 340/825.79
[58] Field of Search ............ 340/365 R, 365 S, 365 C, 340/825.79; 178/17 C, 18

[56] References Cited

U.S. PATENT DOCUMENTS 4,074,261 2/1978 Van der Gaag ............... 340/825.79
4,415,781 11/1983 Frame ............................ 340/365 S
4,429,301 1/1984 Crumley .......................... 340/365 S Primary Examiner—James J. Groody
Attorney, Agent, or Firm—Head, Johnson & Stevenson

[57] ABSTRACT

An improved multikey matrix keyboard for inputting data into a computer, wherein pressing a key places in circuit the point of intersection of a plurality of row conductors and a plurality of column conductors respectively connected to portions of separate sets of row and column sequential series of measurable electrical elements whose cumulative values correspond to the specific row and column of the pressed key. By employing a plurality of row and column key output circuits, the number of keys present in the matrix keyboard is exponentially increased.

7 Claims, 1 Drawing Figure

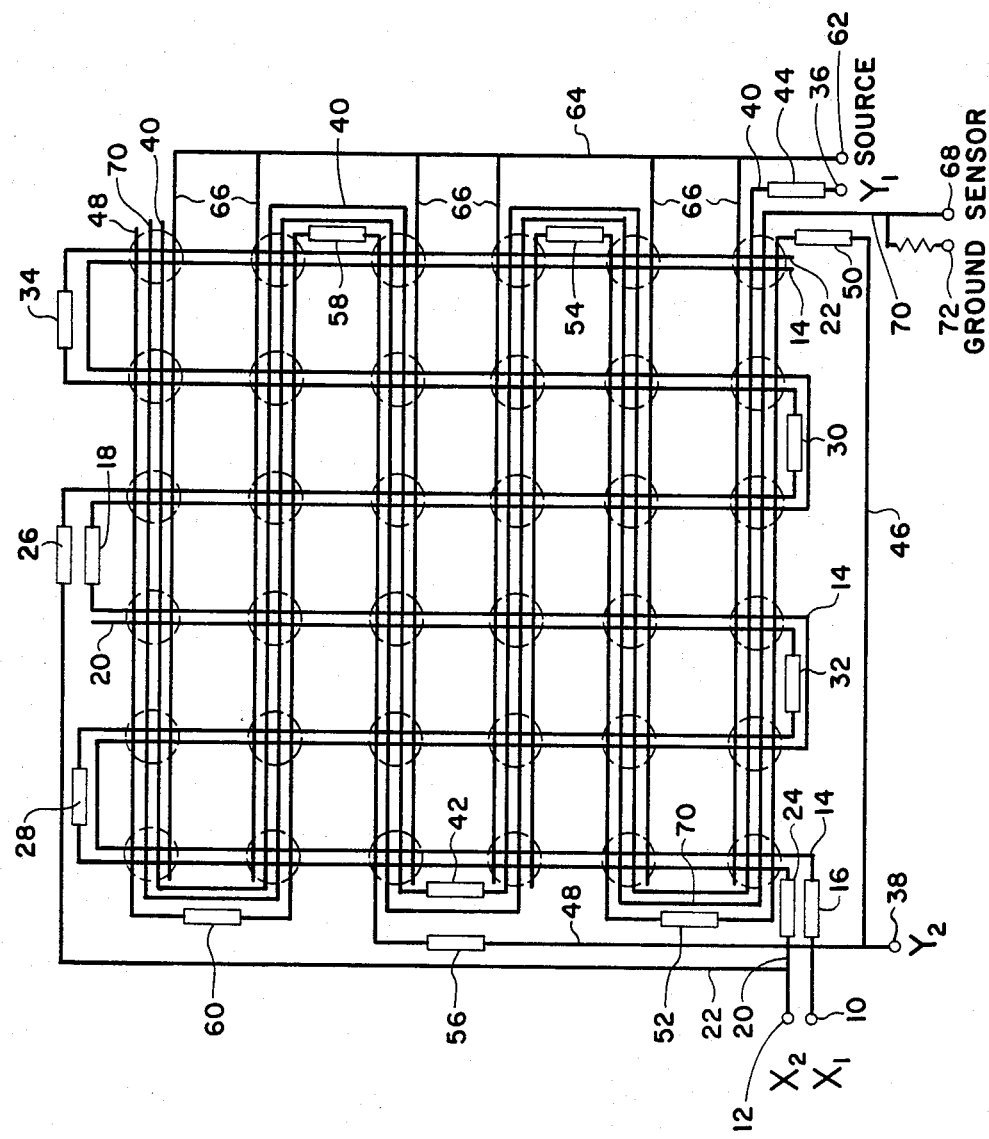

MATRIX KEYBOARD WITH PLURALITY OF SEQUENCES OF CASCADED ELECTRICAL ELEMENTS

BACKGROUND OF THE INVENTION

1. Field of the Invention

This invention relates to an improved matrix keyboard involving multiple electrical measurements per key coordinate. More specifically, the invention relates to a matrix keyboard involving a plurality of electrical measurement outputs to establish column and row coordinates of the key being pressed such as to increase the total number of keys on the keyboard.

2. Description of the Prior Art

Multikey keyboards for inputting data into a computer generally involve a plurality of normally open switches wherein the pressing of each key of the keyboard closes a corresponding switch. The set of normally open switches can be viewed as defining a switch matrix or switch array which in the conventional prior art keyboards have a plurality of input lines and a plurality of output lines. Pressing a key on the keyboard thus closing the corresponding switch creates electrical continuity and completes the circuit between the specific input and output lines corresponding to the respective position or identity of the key being pressed. This plurality of keyboard leads, in the conventional keyboard, is connected to at least one encoder which translates or converts the signals from the multiple key input circuits into a single alphanumeric coded output signal; e.g. into ASCII or binary coded decimal (BCD) format or the equivalent. The output signal from the keyboard encoder can then either be directed to the computer as the keyboard input or can be further processed by additional dedicated keyboard circuitry, depending on the particular manufacturing and overall computer system requirements, before entering the computer. Thus, it is not uncommon to find that the keyboard in addition to having an encoder will have its own dedicated memory and logic circuit essentially duplicating, in principle, that which the central processing unit (CPU) is theoretically capable of doing and consequently, increasing the cost of the keyboard. In practice the presence of multiple input and output lines from the keyboard to the encoder tends to limit the number of keys present on the keyboard.

In a recent copending U. S. patent application based on and claiming priority to a French application, the present inventor discloses a resistive multikey computer keyboard involving an inexpensive yet reliable printed circuit array of flexible keys. According to this matrix keyboard, a portion of a series of sequential resistors are brought into the keyboard output circuit such that the cumulative values of the output resistance circuits uniquely determines the X and Y ranks of the pressed key. In a pair of concurrently filed and commonly assigned U.S. patent applications, multikey keyboards based on time delay elements and capacity circuit values are disclosed. In principle, the number of keys present on a matrix keyboard based on any arbitrary electrical measurement of a cascaded serial sequence of electrical elements selectively introduced into the keyboard output circuits is limited by the ability of the computer to resolve and distinguish successive cumulative electrical measurement values. The present invention is considered an improvement on the basic concept of the cascaded sequential electrical element keyboard in that it provides a method of exponentially increasing the number of keys present on a matrix keyboard without exceeding a given sensitivity and dynamic range of the existing computer's measurement capabilities.

SUMMARY OF THE INVENTION

In view of the limitations associated with the prior art multikey matrix keyboard, I have discovered a method of exponentially increasing the number of keys present on the matrix keyboard without exceeding the particular computer's inherent electrical measurement capabilities with respect to electrical resolution, sensitivity and dynamic range. According to the present invention, the number of keys is increased by providing a plurality of separate output terminals and output circuits for determining the row and column (the X and Y rank) of the key being pressed. Conceptually, the present invention systematically divides the keyboard matrix into subsets or subdivisions and then each subset into progressively smaller component sets until ultimately reaching a set of individual rows or columns of keys. Each successive subdivision involves one keyboard output circuit with associated output lead or terminal, a cascaded series of measurable electrical elements, and conductor(s). Each keyboard output circuit is also operatively connected to every key switch such that when a key is pressed a portion of the cascaded measurable electrical elements associated with identifying the specific subdivision in which that key resides is placed in circuit with the respective keyboard output lead. In this manner, the specific X and/or Y rank (i.e., the colum and row location) of the pressed key is determined by the composite of the keyboard outputs (i.e., a plurality of electrical measurement) rather than by one output value. Hence, the particular resolution and/or dynamic range limitation of the computer limits the number of divisions per subdivision or subset, but not the number of overall keys present on the keyboard.

Thus, the present invention provides a multikey keyboard for inputting data into a computer comprising:

(a) a plurality of normally open, key activated, switch means arranged in a matrix like configuration of rows and columns with one switch means for each key of the keyboard;

(b) a plurality of n row output circuits wherein each of the row output circuits comprise an output terminal electrically connected to separate cascaded conductors and measurable electrical elements and wherein each of the n row output circuits are operatively connected to each of the plurality of switch means such that the set of cumulative measurable electrical elements between each key and respective output terminal define a unique combination of n values which serve to identify the respective row of the keys;

(c) a plurality of m column output circuits wherein each of the column output circuits comprise an output terminal electrically connected to separate cascaded conductors and measurable electrical elements and wherein each of the m column output circuits are operatively connected to each of the plurality of switch means such that the set of cumulative measurable electrical elements between each key and the respective output terminal define a unique combination of m values which serve to identify the respective column of the key; and (d) a common source circuit operative connected to each of the plurality of switch means such that when a key is pressed the corresponding normally open switch means closes, thus completing the circuit between the common source circuit and that portion of the n row output circuits and m column output circuits that serve to identify the row and column of the pressed key, thus allowing the computer to establish which key was pressed by measuring the n plus m cumulative electrical property values, where n and m are integers.

It is an object of the present invention to provide a multikey computer matrix keyboard that allows the computer to distinguish which key is being pressed by virtue of measuring the electrical properties of a plurality of electrical circuits completed by pressing the key. It is another object that the number of keys present on the matrix keyboard be exponentially increased and not be limited by the electrical measuring capabilities of the computer. Fulfillment of these objects and the presence and fulfillment of additional objects will be apparent upon complete reading of the specification and claims taken in conjunction with the attached drawing.

DESCRIPTION OF THE DRAWING

The FIGURE is a schematic illustration of a simplified thirty-six key matrix keyboard involving two row and two column outputs and no more than three consecutive electrical elements in series.

DESCRIPTION OF THE PREFERRED EMBODIMENTS

The improved matrix keyboard, according to the present invention, how it functions and how it increases the number of keys on the matrix keyboard can perhaps be best explained and understood by reference to the drawing. Illustrated in the drawing is a typical thirty-six key (6 by 6) matrix keyboard involving a total of seven keyboard terminals or circuits compatible or at least suggestive of the keyboard to CPU connection employed in contemporary home computers and the like (e.g., the Apple II). As further illsutrated, the schematic wiring diagram of the multikey matrix keyboard involves two printed circuit layers facing each other wherein the predominantly horizontal row determining circuits are on one sheet and the predominantly vertical column circuits are on the other sheet. The wiring diagram according to the present invention is further characterized in that within a given printed layer or sheet the conductors in a given rank (row or column) are alternately connected to one of the two extremities of the corresponding conductors in the next parallel rank. In this manner, the conductors on each printed sheet wind in a serpentine fashion from one row or column of keys to the next maintaining a path that is essentially electrically parallel, making contact with each key switch and avoiding conductor crossovers.

As illustrated in the FIGURE, the two column determining keyboard output circuits involve a pair of output terminals 10 and 12, designated as $X_1$ and $X_2$. The $X_1$ output terminal 10 is connected to a single conductor 14 which contains a pair of measurable electrical elements 16 and 18. The elements 16 and 18 divide the keyboard matrix into two subsets of columns of keys involving the first through third column and the fourth through sixth column. If a key in the first three columns is pressed, the measured electrical value of output terminal 10 corresponds to element 16. If a key in the fourth through sixth column is pressed, the measured electrical value of output terminal 10 corresponds to the sum of elements 16 and 18.

The $X_2$ output terminal 12 is connected to two conductors 20 and 22, each directed to either the first three columns or the last three columns of keys and each contains separate series of three electrical elements. The three serial electrical elements in conductor 20 are positioned such that the measured value at the output terminal 12 distinguishes whether the pressed key is in the first, second or third column. Similarly, the three serial electrical elements in conductor 22 are positioned such that the measured value at output terminal 12 distinguishes whether the pressed key is in the fourth, fifth or sixth column. In other words, if the key pressed is in either the first or fourth column, the measured value at the $X_2$ terminal 12 will correspond to one electrical elements 24 or 26; if in either the second or fifth column, the value is the sum of elements 24 and 28 or elements 26 and 30; and in either the third or sixth column, the cumulative value is the sum of elements 24, 28 and 32 or elements 26, 30 and 34.

In an analogous manner, the two row determining keyboard output circuits involve terminals 36 and 38, designated as $Y_1$ and $Y_2$. The $Y_1$ outlet terminal 36 is connected to a single conductor 40 which contains a pair of measurable electrical elements 42 and 44. The elements 42 and 44 divide the keyboard matrix into upper and lower halves. The keys in the upper three rows bring electrical elements 42 and 44 into the $Y_1$ output circuit, while keys in the lower half of the matrix bring only electrical element 44 into the $Y_1$ output circuit. The $Y_2$ output circuit 38 is connected to two conductors 46 and 48, each involving three electrical elements in series. Conductor 46 makes contact with the lower three rows of the keys with electrical elements 50, 52 and 54 positioned such as to distinguish which of the rows contain the pressed key. Conductor 48 makes contact with the key switches of the upper three rows of keys and determines which row the pressed key is in by providing electrical elements 56, 58 and 60 between each respective row.

The drawing also illustrates the presence of a source circuit which is operatively connected to each key switch of the matrix keyboard and a sensor circuit also operatively connected to each key switch. Both the source circuit and the sensor circuit are printed on the same sheet or layer containing the row conductors. It should be understood that both or either circuit could be printed on the sheet containing the column conductors. The source circuit is made up of an input terminal 62 connected to a common conductor 64 which branches at each row (in the illustrated embodiment) into a plurality of row conductors 66 which represent a common source circuit to each key switch. The sensor circuit involves a keyboard output terminal 68 and a single conductor 70 that in the illustrated embodiment is resistively connected to an optional keyboard ground output 72. The sensor circuit conductor 70 passes sequentially from row to row thus is operatively connected to all keys.

During operation of the keyboard, the computer operator presses a key, represented as dashed circles on the FIGURE, thus closing the electrical circuit between the common source circuit keyboard output terminal 64 and the row and column output terminal $Y_1$, $Y_2$, $X_1$ and $X_2$, as well as the signal output terminal 68. In other words, pressing the key brings into circuit that portion of each of the cascaded series of electrical elements that collectively correspond to and uniquely identify the position of the pressed key. The pressed key also closes the circuit between the common source circuit and the sensor circuit, thus alerting the computer that a key is being pressed. Upon receiving the signal that a key is pressed, the computer can proceed to make the necessary electrical measurements associated with the keyboard output circuits $X_1$, $X_2$, $Y_1$ and $Y_2$, thus identifying the key being pressed. Since the pressing of the key is a manual operation of a time duration on the order of fifty milliseconds or greater, the computer can reliably make several measurements during the pressing of the key. From the set of electrical measurements, the identity of the key can be distinguished and the corresponding function or data input can be performed by the computer.

As illustrated in the drawing, the rows and columns are subdivided into two groups of three rows and three columns. Keyboard output circuit $Y_1$ and $X_1$ identify in which subdivision the pressed key is located. The other two keyboard output circuits $Y_2$ and $X_2$ identify in which relative row and column the pressed key is located. For example, in the specific embodiment being illustrated, the following table of cumulative electrical measurement values will uniquely establish the row and column of the pressed key.

TABLE

| ROW | $Y_1$ MEASUREMENT | $Y_2$ MEASUREMENT |
|---|---|---|
| 1 | Sum of Elements 42 + 44 | Sum of Elements 56 + 58 + 60 |
| 2 | Sum of Elements 42 + 44 | Sum of Elements 56 + 58 |
| 3 | Sum of Elements 42 + 44 | Element 56 |
| 4 | Element 44 | Sum of Elements 50 + 52 + 54 |
| 5 | Element 44 | Sum of Elements 50 + 52 |
| 6 | Element 44 | Element 50 |

| COL-UMN | $X_1$ MEASUREMENT | $X_2$ MEASUREMENT |
|---|---|---|
| 1 | Element 16 | Element 24 |
| 2 | Element 16 | Sum of Elements 24 + 28 |
| 3 | Element 16 | Sum of Elements 24 + 28 + 32 |
| 4 | Sum of Elements 16 + 18 | Element 26 |
| 5 | Sum of Elements 16 + 18 | Sum of Elements 26 + 30 |
| 6 | Sum of Elements 16 + 18 | Sum of Elements 26 + 30 + 34 |

In fact, the matrix keyboard illustrated in the drawing can be expanded to a 9 by 9 matrix of eighty-one separate keys without using more than three separate electrical elements in cascaded series and still have a total of only four keyboard output circuits corresponding to the row and column determining measurement. For example, the matrix keyboard can be readily converted to a nine row by six column matrix of keys by merely adding a third measurable element to the upper right end of the conductor 40 of output circuit $Y_1$. Conductor 40 can then be extended to operatively connect to the additional eighteen keys (3 by 6) added vertically on top of the illustrated keyboard. A third electrically parallel branching circuit of three cascaded elements can then be added to the $Y_2$ keyboard output circuit. This third branch of the $Y_2$ circuit would be operatively connected to the additional eighteen keys and would function identically to the branch conductors 46 and 48. The remaining circuits ($X_1$, $X_2$, sensor and common input circuit) would merely be extended or lengthened to accommodate the additional keys.

In a similar manner, an additional three columns can be added to the matrix by inserting a third element at the end of the conductor 14 and extending conductor 14 to engage the new columns of keys. A third branch circuit would also be added to the $X_2$ keyboard output circuit. If both of these modifications were employed simultaneously the matrix keyboard would involve eighty-one keys (a 9 by 9 matrix), two row and two column keyboard outputs and no more than three cascaded elements in series.

In principle, if n elements are cascaded in the row determining circuits and m elements are serially cascaded in the column determining circuits, the prior art n by m matrix can be exponentially increased to a 2n by 2m matrix keyboard, provided a second output circuit to both the row and column circuits are also added. For example, a 10 by 10, one hundred keyed matrix can be converted to a 20 by 20, four hundred keyed keyboard by using four output terminals, rather than two. The use of six output circuits (three rows and three columns) would increase the upper limit of the number of keys on the keyboard to one million, yet the computer would make only six measurements to determine the X and Y rank of the key being pressed. Thus, the improvement of the present invention provides a method for making a very large keyboard array involving conceptually either a square or rectangular matrix of keys with only a modest increase in the number of keyboard output circuits.

The preferred method of constructing a multikey keyboard according to the present invention is to print at least the top layer of the laminated or membrane matris keyboard on a flexible sheet with the printed conductors facing each other as essentially known in the art. Between the printed layers is an intermediate insulating layer with perforations or openings at the conductor intersection corresponding to the keys. In this manner, the top layer can be pressed against the lower layer thus simultaneously completing the electrical contact between all respective circuits.

The actual electrical element and corresponding electrical measurement employed in the keyboard can in principle be any measurable electrical property or electrically induced property, including by way of example, but not limited thereto; resistance, voltage, current, capacitance, time delay, frequency or combinations thereof. It is further contemplated that since the present invention increases the number of keys on the matrix keyboard using fewer electrical elements, the value of each successive element can advantageously be increased nonlinearly to optimize the computer's ability to resolve successive cumulative values of cascaded elements To further illustrate the present invention, the following example is presented demonstrating the fundamental concept of the improved matrix keyboard.

EXAMPLE

A resistive membrane type thirty-six key (6 by 6) matrix keyboard having a circuit configuration equivalent to the drawing and using equal valued resistors is prepared compatible with connecting to the Apple II computer The horitontal $Y_1$ and $Y_2$ conductors, a plus 5 volt input circuit and a sensor circuit are printed on the upper side of the bottom layer of mylar film. The keyboard output terminal corresponding to the $Y_1$ circuit having a pair of cascaded resistors is connected to pin PDL (3) of the game I/O socket of the Apple II. The $Y_2$ keyboard output terminal having three cascaded resistors is connected to the PDL (1) pin of the same socket, thus completing the row input circuits. Similarly, the keyboard output terminal corresponding to the $X_1$ circuit having the pair of cascaded resistors is connected to pin PDL (2) and $X_2$ output terminal is connected to PDL (0) of the game I/O socket. The sensor circuit terminal is connected to both the switch input pin PB (0) and through a 1Ω resistor to the ground pin of the I/O socket.

When a key is pressed, the plus 5 volt signal from the common source circuit is transmitted to the computer over the sensor circuit and pin PB (0). Upon sensing the presence of the 5 volt signal, the computer begins scanning the four rank determining circuits pins PDL (0), (1), (2) and (3)), making repeated resistance measurements until the identity of the pressed key is established with sufficient confidence for the computer to proceed by performing the data input or function associated with the identified pressed key. Upon loss of the 5 volt signal on the sensor circuit, the computer returns to a scanning mode monitoring the sensor circuit for the next pressed key.

Having thus described the invention with a certain degree of particularity, it is manifest that many changes can be made in the details of construction and arrangement of components without departing from the spirit and scope of this disclosure. Therefore, it is to be understood that the invention is not limited to the embodiments set forth herein for purposes of exemplification, but is to be limited only by the scope of the attached claims, including a full range of equivalents to which each element thereof is entitled.

I claim:

1. In a multikey keyboard for inputting data to a computer wherein the X and Y rank of the pressed key is determined by the closing of a corresponding key switch means that brings into the X and Y keyboard output circuit selected portions of a pair of separate series of electrical elements which respective cumulative values are subsequently measured by the computer to uniquely establish the coordinates of the pressed key, the specific improvement comprising: replacing at least one of said X or Y keyboard output circuits with a plurality of keyboard output circuits wherein each of said plurality of keyboard output circuits comprise a keyboard output terminal electrically connected to separate sequences of cascaded electrical elements and associated conductors such that pressing of a key introduces into said respective plurality of keyboard output circuits a corresponding portion of each of said separate sequences of electrical elements that in combination uniquely define the rank of the key being pressed.

2. An improved multikey keyboard of claim 1 wherein both the X and Y keyboard ouput circuits are replaced with a plurality of said keyboard output circuits.

3. An improved multikey keyboard of claim 2 wherein both the X and Y keyboard output circuits are replaced by two separate sequences of cascaded electrical elements, thus increasing the number of keyboard output terminals from two to four and simultaneously quadrupling the number of keys on the keyboard.

4. A multikey keyboard for inputting data into a computer comprising:

(a) a plurality of normally open, key activated, switch means arranged in a matrix like configuration of rows and columns with one switch means for each key of the keyboard;

(b) a plurality of n row output circuits wherein each of said row output circuits comprise an output terminal electrically connected to separate cascaded conductors and measurable electrical elements and wherein each of said n row output circuits are operatively connected to each of said plurality of switch means such that the set of cumulative measurable electrical elements between each key and respective output terminal define a unique combination of n values which serve to identify the respective row of said keys;

(c) a plurality of m column output circuits wherein each of said column output circuits comprise an output terminal electrically connected to separate cascaded conductors and measurable electrical elements and wherein each of said m column output circuits are operatively connected to each of said plurality of switch means such that the set of cumulative measurable electrical elements between each key and the respective output terminal define a unique combination of m values which serve to identify the respective column of said key; and (d) a common source circuit operatively connected to each of said plurality of switch means such that when a key is pressed the corresponding normally open switch means closes, thus completing the circuit between said common source circuit and that portion of said n row output circuits and m column output circuits that serve to identify the row and column of the pressed key, thus allowing the computer to establish which key was pressed by measuring the n plus m cumulative electrical property values, where n and m are integers.

5. A multikey keyboard of claim 4 further comprising a sensor output circuit operably connected to each of said plurality of said key actuated, switch means which when a key is pressed completes the circuit between said common source circuit and said sensor output circuit, thus outputting a separate signal to the computer indicating that a key has been pressed and that said n plus m cumulative electrical property measurements should now take place.

6. A multikey keyboard of claim 1, 2, 3, 4 or 5 wherein said keyboard further comprises two opposed printed circuit sheets separated by an insulated sheet perforated at the positions of the keys such that said switch means is created by having at least one of said opposed printed circuit sheets being sufficiently flexible such that said flexible sheet may be pressed at the position of said key, thus completing the electrical contact between said common source circuit and said output circuits by physically contacting said printed circuit sheets to each other.

7. A multikey keyboard of claim 6 wherein the individual values of said measurable electrical elements within said sequential series of cascaded electrical elements are increased nonlinearly as they approach said respective output terminals such as to further enhance the computer's ability to discriminate which key was pressed.

* * * * *